United States Patent [19]

Hammura et al.

[11] Patent Number: 4,707,691

[45] Date of Patent: Nov. 17, 1987

[54] OSCILLOSCOPE

[75] Inventors: Hisao Hammura, Kumagaya; Tetsuro Echizen; Yoshio Sanada, both of Okabe, all of Japan

[73] Assignee: Shin-Kobe Electric Machinery Co. Ltd., Tokyo, Japan

[21] Appl. No.: 602,802

[22] Filed: Apr. 23, 1984

[30] Foreign Application Priority Data

Apr. 26, 1983 [JP] Japan ................................ 58-73450

[51] Int. Cl.[4] .............................................. G09G 3/00
[52] U.S. Cl. ..................................... 340/754; 340/784
[58] Field of Search ............... 340/754, 745, 750, 784; 324/121 R

[56] References Cited

U.S. PATENT DOCUMENTS

| | | | |
|---|---|---|---|
| 4,225,940 | 9/1980 | Moriyasu et al. | 340/745 X |
| 4,250,503 | 2/1981 | Shanks | 340/754 |
| 4,346,378 | 8/1982 | Shanks | 340/754 |
| 4,465,999 | 8/1984 | Tsuzuki et al. | 340/754 X |
| 4,468,661 | 8/1984 | Van Doorn et al. | 340/754 X |
| 4,510,444 | 4/1985 | Haussel et al. | 324/121 R |

Primary Examiner—Gerald L. Brigance
Assistant Examiner—Jeffery A. Brier
Attorney, Agent, or Firm—Pearne, Gordon, McCoy & Granger

[57] ABSTRACT

This invention relates to an oscilloscope in which waveforms can be indicated on a matrix type plane display such as a liquid-crystal display or plasma display as well as on a CRT (cathode-ray tube). The oscilloscope of the invention comprises a memory in which waveform data can be written or from which it can be read, a writing control circuit to control writing the waveform data on the memory, a reading control circuit to control reading the waveform data from the memory and a display to indicate the read waveform data. The writing and reading control circuits have a predetermined writing prohibition period during which writing is prohibited after writing all the data of one waveform. The writing period during which data of one waveform is written has a minimum uniform length, and a period during which the data can be availably read from the memory becomes longer as the writing frequency becomes longer.

4 Claims, 3 Drawing Figures

4,707,691

OSCILLOSCOPE

BACKGROUND OF THE INVENTION

A prior CRT type oscilloscope can scan electronic beams at extremely high speed in accordance with the input waveform, but a prior matrix type flat display has scanning speed and system limited to individual ones. Thus, in the matrix type flat display, the input waveform is temporarily stored in a memory and required to be read in synchronization with scanning of the matrix type flat display. This prevents the waveform data from being displayed during the writing time. Thus, it will be noted that an image flickers and is therefore observed wtih difficulty.

SUMMARY OF THE INVENTION

Accordingly, it is a principal object of the invention to provide an oscilloscope having a matrix type plane display used adapted to be easy to observe waveform data.

It is another object of the invention to provide an oscilloscope adapted to have circuits simplified and be economically provided.

In accordance with the invention, there is provided an oscilloscope comprising a memory in which waveform data are written and from which said waveform data are read, a writing control circuit to control writing said waveform data in said memory, a reading control circuit to control reading said waveform data from said memory and a display means for displaying said read waveform data, characterized by writing prohibition means in said writing control circuit to establish a certain writing prohibition period after all the data of one waveform have been written and to establish a minimum uniform length writing period of each data of said one waveform, and a reading period control in said reading control circuit to establish a longer reading period as the writing frequency becomes lower.

BRIEF DESCRIPTION OF THE DRAWINGS

The above and other objects and features of the invention will be apparent from the description of the embodiment taken along with reference to the accompanying drawings in which.

DETAILED DESCRIPTION OF THE EMBODIMENT

Figure 1:
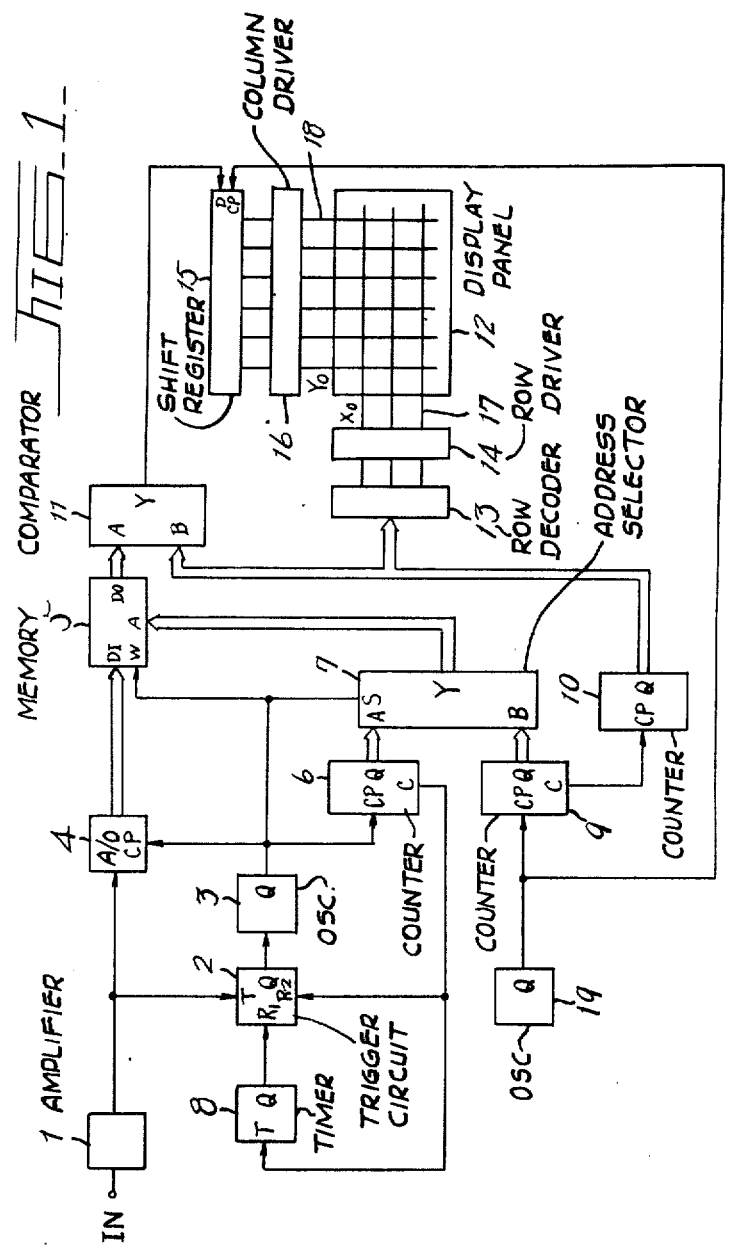
FIG. 1 is a schematic diagram of an oscilloscope constructed in accordance with one embodiment of the invention.
Figure 2:
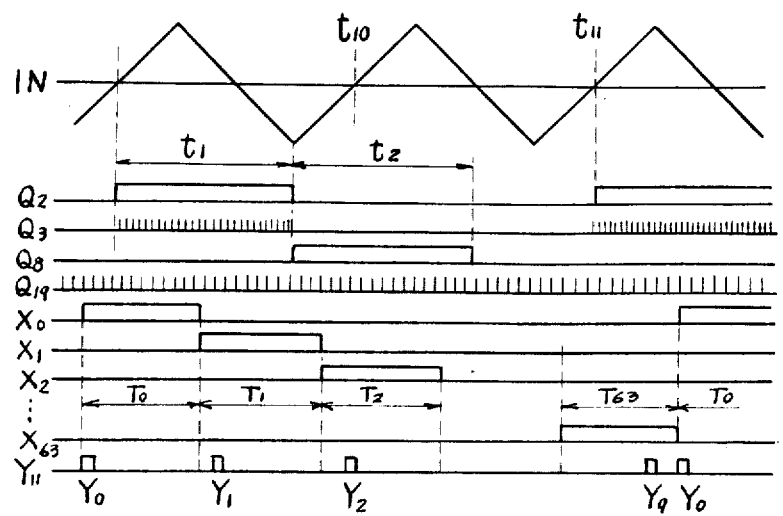
FIGS. 2 and 3 illustrate waveforms on various portions of the oscilloscope of the invention when it is operated.
Figure 3:
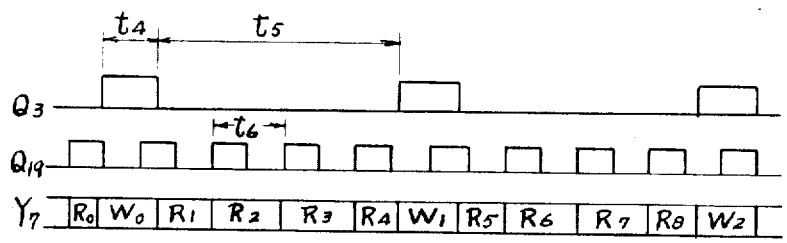

Referring now to FIG. 1, there is shown an oscilloscope constructed in accordance with one embodiment of the invention. An input signal I N of the oscilloscope is amplified by an amplifier 1 and supplied to a triggering circuit 2 and also to an analog-to-digital converter 4. The triggering circuit 2 has one triggering input T, two reset inputs R 1 and R 2 and one output Q. When a signal supplied to the triggering input T has predetermined conditions met, a signal is produced at the output Q. As viewed in FIG. 2, this occurs at the center of positive slopes of the input signal I N. In FIGS. 2 and 3, the waveform at the output Q of the element 2 is indicated by Q2.

The output from the triggering circuit 2 is supplied to a writing oscillator 3 which begins to be operated by the output from the triggering cicuit 2. An output from the oscillator 3 is indicated by writing clock pulse Q3. The number of the pulses from Q3 is 240 while its frequency varies approximately from 1 Hz to 10 MHz in direct accordance with the input signal I N. The writing clock pulses from Q3 are supplied to a clock pulse input cp of the analog-to-digital converter 4, a clock pulse input cp of a writing counter 6, a selecting input S of an address selector 7 and a writing input W of a memory 5.

The analog-to-digital converter 4 converts the output signal from the amplifier 1 into a digital signal in synchronization with the writing clock pulse Q3 and outputs it. In the illustrated embodiment, the digital signal has the value of 0 to 63 on a 6-bit signal and is supplied to a digital input DI of the memory 5. In FIG. 1, a double line indicates a bundle of signal lines. The digital signals are produced 240 times per one triggering.

The writing counter 6 counts the writing clock pulses Q3 from the writing oscillator 3. This writing counter 6 produces a writing address signal Q6 having a value of 0 to 239 and a carry signal C6 when it counts 239. The carry signal C6 is supplied to the reset input R2 of the triggering circuit 2 to reset the output Q2. Thus, it will be noted that the writing clock pulses Q3 stop when they reach just 240 pulses as aforementioned. The carry signal C6 is supplied also to a triggering input T of a timer 8. Although described in detail later, the timer 8 produces an output signal Q8 of predetermined pulse width t2 when triggered. Since the output signal Q8 is supplied to another rest input R1 of the triggering circuit 2, the latter circuit is prohibited from triggering during the period t2.

Although described in detail later, the address selector 7 outputs as a memory address signal Y7 the writing counter output Q8 which is connected to an input A of the address selector 7 while the writing clock Q3 connected to a selecting input S of the address selector 7 is a logic high or logic 1. The memory address signal Y7 is supplied to the memory 5. Thus, it will be noted that 240 data bytes in the digital signal will be sequentially written in the memory 5. The memory 5 may have a capacity of 240 words of 6 bits, but is required to have the writing speed of $10^6$ times per second in case that the writing clock Q3 is 10 MHz.

A reading oscillator 19 has an oscillation frequency of approximately 700 KHz. A reading output of the reading oscillator 19 is reading clock pusle Q19. The reading clock pulse Q19 is supplied to a clock pulse input CP of a row or line counter 9. The row counter 9 counts the reading clock pulses to produce a reading address Q9 having a value of 0 to 239. When the row counter 9 counts 239, it produces a carry output C9, which is supplied to a clock pulse input CP of a line counter 10. The line counter 10 counts the carry output C9 to produce a line address Q10 having a value of 0 to 63.

A matrix type flat display comprises elements 12 to 18. A display panel 12 comprises 64 row electrodes 17 (X 0 through X 6 3) and 240 column electrodes 18 (Y 0 through Y 2 3 9). Cross points of respective electrodes 17 and 18 are picture elements. A row decoder 13 receives a row or line address Q10 to decode it so as to sequentially make one of 64 outputs a high. A row driver 14 serves to convert the decoded signal into a signal suitable for driving the row electrodes 17. The row electrodes X 0 through X 6 3 are sequentially scanned so that one line electrode 17 is selected at one time. In FIG. 2, T 0 through T 6 3 indicate scanning periods of the respective row electrodes.

It should be noted that it is required to apply to the column electrodes 18 a signal to indicate turning on or off picture elements on one line in accordance with scanning of the row electrodes 17. This is accomplished by feeding 240 data bytes of one line to a data input D of a column shift register 15 at the time required. The reading clock pulse Q19 for shifting is supplied to a clock pulse input CP of the column shift register 15. A column driver 16 serves to convert 240 output signals from the column shift register 15 into signals suitable for driving the column electrodes 18.

After the writing operation as aforementioned, when the writing clock pulses Q3 are not produced, the selecting input S of the address selector 7 is a logic 0. At that time, the address selector 7 produces as the memory address signal Y7 the reading address Q9 supplied to the input B. Since the writing input W of the memory 5 is a logic 0 at that time, the memory 5 sequentially produces the written data at an output D O. A comparator 11 compares the output D O from the memory 5 with the row address Q10 from the line counter 10 to produce an output signal Y11 when they are equal to each other. The output signal Y11 is supplied to the data input D of the column shift register 15.

An example of waveform of Y11 is shown in FIG. 2. If the first data (bytes of 0) written in the memory 5 is 0, the comparator 11 produces the signal because the values to be compared are equal to each other at the beginning of the period T 1. If there are other data having a value of 0, the signal is produced at the corresponding time during period T 1. Thus, all the data having a value of 0 will be indicated on the first row X 0 of the display panel 12. Similarly, if the value of the next bytes from the memory 5 is 1, a signal is produced at the second position (corresponding to Y 1) of the period T 1. By repeating the above operation, the complete waveform is displayed on the display panel 12. The indication is required to be repeated several decade times per second so that there is no flicker. In the embodiment, the number of repetitions per second is 46 Hz (700 KHz: 240:64).

In the above writing and reading (or indicating) operations, since no reading address Q9 is applied to the memory 5 during the writing period, the random patterns are displayed and it is difficult to observe this waveform pattern. In the invention, the ratio of writing to reading time is so maintained at a value smaller than a predetermined constant value that the waveform pattern can be easily observed.

FIG. 2 shows an example in which the frequency of the input signal I N is relatively higher than that in FIG. 3. In the example, since the frequency of the writing clock pulse Q3 is also higher, the period t1 is shorter than 1 ms. In this case, the writing operation is prohibited during the next 100 ms by maintaining the pulse width t2 of the timer 8 at 100 ms. More particularly, the next point of triggering of the input signal I N is expected to be t10, but triggering is delayed until t11. Thus, it will be noted that the ratio of writing to reading time will be less than 1% with the result that a good image can be obtained.

FIG. 3 shows operating waveforms in case the frequency of the input signal I N is lower than that in FIG. 2. In this case, since the frequency of the writing clock pulse Q3 is also lower, t1 is longer. If the frequency of the writing clock pulse Q3 is 100 Hz, for example, t1 is 2.4 seconds, which causes the effectiveness of the timer 8 to be lost. In such a case, the total of t4 and t5 is 10 ms. According to the invention, the pulse width t4 of the writing clock pulse Q3 is as small as possible. Since t4 is the period for writing of the memory 5, it may be approximately 100 ns. Thus, it will be understood that the period t1 which corresponds to the nominal period during which all the data of 240 bytes are written is relatively longer, but the time t4 during which the memory 5 is actually used for the writing operation is considerably shorter than the remaining time t5.

The frequency of the reading clock pulse Q19 is 700 KHz which is much higher than 100 Hz of the writing clock pulse Q3, when the data in the memory 5 can be correctly read during the time t5. The memory address Y7 is shown in the lowermost passage of FIG. 3. In FIG. 3, W0, W1 etc. designate the writing address while R0, R1 etc. designate the reading address. In this case, the ratio of net writing to reading periods t4 to t5 is 0.1%. In FIG. 3, if the frequency of writing clock Q3 is higher, t5 is equal to or less than t4 so that the data cannot be correctly read. But, it will be understood that the period t2 of FIG. 2 will be available for correctly reading the data.

As noted from the above description, although the oscilloscope has the matrix type flat display for which the memory is essential, the ratio of writing to reading periods of the memory can be kept at a lower value so that the displayed waveform can be easily observed. This causes the circuitry to be more simplified because two memories which are alternately used are not required.

Although the invention which controls the memory is suitable for the oscilloscope having a liquid-crystal display which has relatively late response and does not respond to the momentary erroneous data, it may be applicable for the oscilloscope having a conventional cathode-ray tube. Thus, it should be noted that this invention can be applied to the oscilloscope having the memory. Although some preferred embodiments of the invention have been described and illustrated, it will be understood by those skilled in the art that they are by way of example and that various changes and modifications may be made without departing from the spirit and scope of the invention, which is intended to be defined only by the appended claims.

What is claimed is:

1. An oscilloscope comprising a memory in which waveform data are written and from which said wafeform data are read, a writing control circuit to control writing of said waveform data to said memory, said waveform data being written at differing frequencies, a reading control circuit to control reading of said waveform data from said memory and a matrix-type display means for displaying said read waveform data, characterized by a writing prohibition means in said writing control circuit to establish a certain writing prohibition period after all the data of one waveform have been written in said memory for waveform data written at all frequencies and to establish a minimum uniform length writing period for each data of said one waveform, and to establish a reading period control during writing of said waveform data in said reading control circuit to establish a longer reading period as the writing frequency becomes lower for said waveform data, said longer reading period occurring between each minimum uniform length writing period.

2. An oscilloscope as set forth in claim 1, wherein said writing control circuit comprises an analog-to-digital converter to convert an input signal into a digital signal, a triggering circuit to receive said input signal and to produce a triggering signal, a writing oscillator to receive said triggering signal and to produce writing clock pulses, a writing counter to count said writing clock pulses to produce an output signal during counting and to produce a reset signal after said writing clock pulses are finished, and an address selector to receive said writing clock pulses and said output signal from said writing counter to produce an address signal to said memory while each of said writing clock pulses appears.

3. An oscilloscope as set forth in claim 2, and further comprising a timer to receive said reset signal from said writing counter to produce a writing prohibition signal to stop triggering of said triggering circuit.

4. An oscilloscope as set forth in claim 3, wherein said writing oscillator is so set to produce each of said writing clock pulses having a time width less than that of the time between successive clock pulses.

* * * * *

UNITED STATES PATENT AND TRADEMARK OFFICE
CERTIFICATE OF CORRECTION

PATENT NO. : 4,707,691

DATED : November 17, 1987

INVENTOR(S) : Hisao Hammura et al.

It is certified that error appears in the above-identified patent and that said Letters Patent is hereby corrected as shown below:

Column 2, line 32, "rest"
   should be --reset--

Column 2, line 49, after "19 is"
   insert --a--

Column 2, line 49, "pusle"
   should be --pulse--

Column 4, lines 49 & 50, "wafeform"
   should be --waveform--

Signed and Sealed this

Fourteenth Day of June, 1988

Attest:

DONALD J. QUIGG

Attesting Officer     Commissioner of Patents and Trademarks